(12) United States Patent
Chiang et al.

(10) Patent No.: US 10,068,963 B2
(45) Date of Patent: Sep. 4, 2018

(54) FIN-TYPE FIELD EFFECT TRANSISTOR AND METHOD OF FORMING THE SAME

(71) Applicant: United Microelectronics Corp., Hsinchu (TW)

(72) Inventors: Huai-Tzu Chiang, Tainan (TW); Sheng-Hao Lin, Hsinchu County (TW); Hao-Ming Lee, Taichung (TW); Yu-Ru Yang, Hsinchu County (TW); Shih-Hsien Huang, Kaohsiung (TW); Chien-Hung Chen, Hsinchu County (TW); Chun-Yuan Wu, Yunlin County (TW); Cheng-Tzung Tsai, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 53 days.

(21) Appl. No.: 14/936,370

(22) Filed: Nov. 9, 2015

(65) Prior Publication Data

US 2017/0098692 A1    Apr. 6, 2017

(30) Foreign Application Priority Data

Oct. 2, 2015 (TW) .............................. 104132649 A

(51) Int. Cl.
| | |
|---|---|
| *H01L 29/78* | (2006.01) |
| *H01L 29/16* | (2006.01) |
| *H01L 29/161* | (2006.01) |
| *H01L 29/06* | (2006.01) |
| *H01L 29/10* | (2006.01) |
| *H01L 29/66* | (2006.01) |
| *H01L 21/225* | (2006.01) |
| *H01L 21/768* | (2006.01) |

(52) U.S. Cl.
CPC ...... *H01L 29/0615* (2013.01); *H01L 21/2253* (2013.01); *H01L 21/76802* (2013.01); *H01L 21/76871* (2013.01); *H01L 29/1033* (2013.01); *H01L 29/1054* (2013.01); *H01L 29/66795* (2013.01); *H01L 29/785* (2013.01)

(58) Field of Classification Search
CPC ....... H01L 29/17851; H01L 29/166795; H01L 29/116; H01L 29/1161; H01L 29/1165; H01L 29/10653; H01L 29/1517; H01L 29/42364; H01L 21/02236; H01L 21/02255; H01L 21/28167
See application file for complete search history.

(56) References Cited

U.S. PATENT DOCUMENTS

| | | | |
|---|---|---|---|
| 7,799,592 B2 | 9/2010 | Lochtefeld | |
| 2006/0019462 A1* | 1/2006 | Cheng | H01L 21/823412 438/400 |
| 2008/0073667 A1* | 3/2008 | Lochtefeld | H01L 29/66795 257/190 |
| 2011/0049568 A1* | 3/2011 | Lochtefeld | H01L 21/02381 257/190 |

(Continued)

*Primary Examiner* — Fernando L Toledo
*Assistant Examiner* — Lawrence-Linh T Nguyen
(74) *Attorney, Agent, or Firm* — J.C. Patents

(57) ABSTRACT

Provided is a FinFET including a substrate, at least one fin and at least one gate. A portion of the at least one fin is embedded in the substrate. The at least one fin includes, from bottom to top, a seed layer, a stress relaxation layer and a channel layer. The at least one gate is across the at least one fin. A method of forming a FinFET is further provided.

9 Claims, 3 Drawing Sheets

(56) References Cited

U.S. PATENT DOCUMENTS

| | | | |
|---|---|---|---|
| 2013/0248999 A1* | 9/2013 | Glass | H01L 29/36 257/335 |
| 2015/0144999 A1* | 5/2015 | Ching | H01L 29/66795 257/190 |
| 2015/0214362 A1* | 7/2015 | Oh | H01L 29/7827 257/330 |

* cited by examiner

FIN-TYPE FIELD EFFECT TRANSISTOR AND METHOD OF FORMING THE SAME

CROSS-REFERENCE TO RELATED APPLICATION

This application claims the priority benefit of Taiwan application serial no. 104132649, filed on Oct. 2, 2015. The entirety of the above-mentioned patent application is hereby incorporated by reference herein and made a part of this specification.

FIELD OF THE PRESENT INVENTION

The present invention is related to a semiconductor structure and a method of forming the same, and more generally to a fin-type field effect transistor (FinFET) and a method of forming the same.

DESCRIPTION OF RELATED ART

FinFET devices are developed as the dimensions of integrated circuits are shrunk and the demands for transistors with higher driving currents and smaller sizes are increased. The channel of a FinFET is formed on the top and side surfaces of each fin, so the FinFET is provided with a greater channel length, and the driving current is therefore improved. However, the conventional silicon germanium fin is grown on a silicon substrate, so the lattice mismatch or dislocation occurs therebetween and the FinFET performance is therefore degraded.

SUMMARY OF THE PRESENT INVENTION

Accordingly, the present invention provides a FinFET and a method of forming the same, in which the lattice mismatch or dislocation issue of the conventional fin can be successfully resolved.

The present invention provides a FinFET including a substrate, at least one fin and at least one gate. A portion of the at least one fin is embedded in the substrate. The at least one fin includes, from bottom to top, a seed layer, a stress relaxation layer and a channel layer. The at least one gate is across the at least one fin.

According to an embodiment of the present invention, the FinFET further includes an anti-punch through layer disposed between the stress relaxation layer and the channel layer.

According to an embodiment of the present invention, a germanium concentration of the channel layer is substantially equal to a germanium concentration of the anti-punch through layer, the germanium concentration of the anti-punch through layer is greater than a germanium concentration of the stress relaxation layer, and the germanium concentration of the stress relaxation layer is greater than a germanium concentration of the seed layer.

According to an embodiment of the present invention, the stress relaxation layer has a graded stress distribution, and a germanium concentration of the stress relaxation layer is gradually increased from the seed layer towards the anti-punch through layer.

According to an embodiment of the present invention, a dopant concentration of the anti-punch through layer is greater than a dopant concentration of the stress relaxation layer or the channel layer.

According to an embodiment of the present invention, the FinFET further includes an insulating layer surrounding a lower portion of the at least one fin, wherein a surface of the insulating layer is higher than an interface between the anti-punch through layer and the channel layer.

According to an embodiment of the present invention, a germanium concentration of the channel layer ranges from about 20% to 100%.

According to an embodiment of the present invention, the seed layer and a portion of the stress relaxation layer are disposed in the substrate.

According to an embodiment of the present invention, the substrate and the seed layer have substantially the same lattice constant, and the anti-punch through layer and the channel layer have substantially the same lattice constant.

The present invention further provides a method of forming a FinFET. A substrate is provided, wherein the substrate has an insulating layer formed thereon, the insulating layer has at least one trench formed therein, and the at least one trench extends to a portion of the substrate. A seed layer, a stress relaxation layer and a channel layer are sequentially formed in the at least one trench. A portion of the insulating layer is removed, so as to expose a portion of the channel layer. At least one gate is formed across the channel layer.

According to an embodiment of the present invention, the method further includes forming an anti-punch through layer between the stress relaxation layer and the channel layer.

According to an embodiment of the present invention, a germanium concentration of the channel layer is substantially equal to a germanium concentration of the anti-punch through layer, the germanium concentration of the anti-punch through layer is greater than a germanium concentration of the stress relaxation layer, and the germanium concentration of the stress relaxation layer is greater than a germanium concentration of the seed layer.

According to an embodiment of the present invention, the stress relaxation layer has a graded stress distribution, and a germanium concentration of the stress relaxation layer is gradually increased from the seed layer towards the anti-punch through layer.

According to an embodiment of the present invention, a method of forming each of the seed layer, the stress relaxation layer, the anti-punch through layer and the channel layer includes performing an epitaxial growth process.

According to an embodiment of the present invention, a dopant concentration of the anti-punch through layer is greater than a dopant concentration of the stress relaxation layer or the channel layer.

According to an embodiment of the present invention, a dopant of the anti-punch through layer includes arsenic, phosphorus or boron.

According to an embodiment of the present invention, a surface of the remaining insulating layer is higher than an interface between the anti-punch through layer and the channel layer after the step of removing the portion of the insulating layer.

According to an embodiment of the present invention, a method of forming the at least one trench includes the following steps. The substrate with at least one dummy fin is provided, wherein the insulating layer surrounds the at least one dummy fin. An etching process is performed, so as to remove the at least one dummy fin and a portion of the substrate.

According to an embodiment of the present invention, a germanium concentration of the channel layer ranges from about 20% to 100%.

According to an embodiment of the present invention, the substrate and the seed layer have substantially the same lattice constant, and the anti-punch through layer and the channel layer have substantially the same lattice constant.

In view of the above, in the FinFET of the present invention, by disposing a fin having, from bottom to top, a seed layer, a stress relaxation layer, an anti-punch through layer and a channel layer, the lattice mismatch issue of the conventional fin can be successfully resolved, and the punch through effect can be prevented. Therefore, the device performance can be improved, and the competitive advantage can be achieved.

Several exemplary embodiments accompanied with figures are described in detail below to further describe the present invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
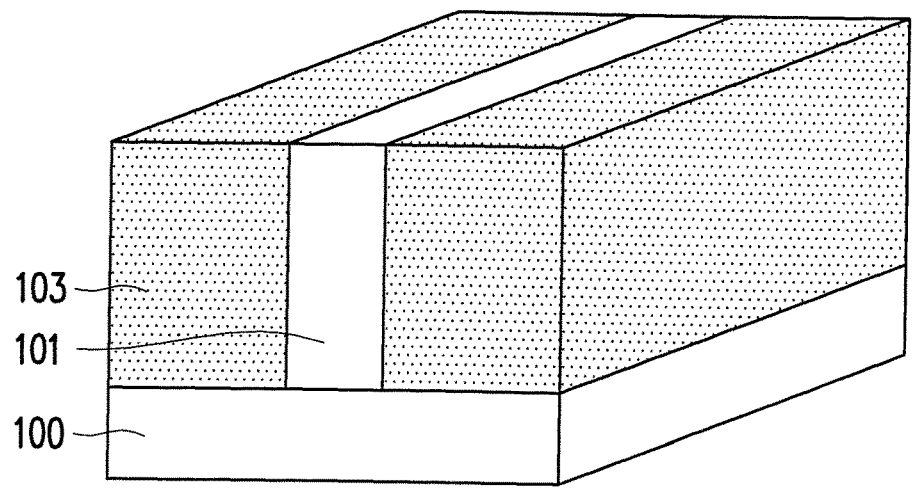
FIG. 1A to FIG. 1E are schematic perspective views of a method of forming a FinFET according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are schematic perspective views of a method of forming a FinFET according to an embodiment of the present invention. FIG. 2 is a schematic cross-sectional view taken along line I-I of FIG. 1E.

Figure 2:
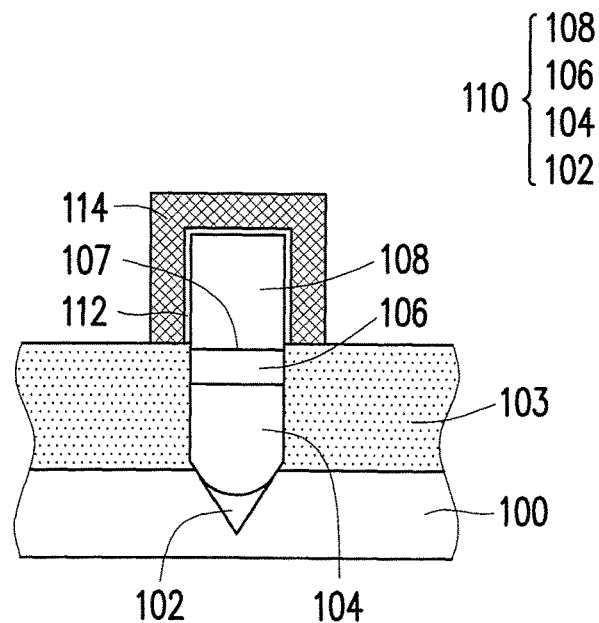
FIG. 2 is a schematic cross-sectional view taken along line I-I of FIG. 1E.

Referring to FIG. 1A, a substrate 100 with at least one dummy fin 101 is provided. The substrate 100 can be a semiconductor substrate, and the dummy fin 101 can be a semiconductor fin. In an embodiment, the substrate 100 and the dummy fin 101 are made by the same material. For example, the dummy fin 101 and the substrate 100 are made by silicon, but the present invention is not limited thereto. In an embodiment, the method of forming the substrate 100 with the dummy fin 101 includes performing a sidewall image transfer (SIT) technique.

Besides, the substrate 100 has an insulating layer 103 formed thereon, and the insulating layer 103 surrounds the at least one dummy fin 101. The method of forming the insulating layer 103 includes forming an insulating material layer (not shown) on the substrate 100 covering the dummy fin 101. Thereafter, a chemical mechanical polishing (CMP) process is performed by using sidewall image transfer (SIT) pattern on the dummy fin 101 as a polish stop layer (not shown). In an embodiment, after the polishing process, the top of the dummy fin 101 is substantially coplanar with the top of the insulating layer 103.

Figure 1B:
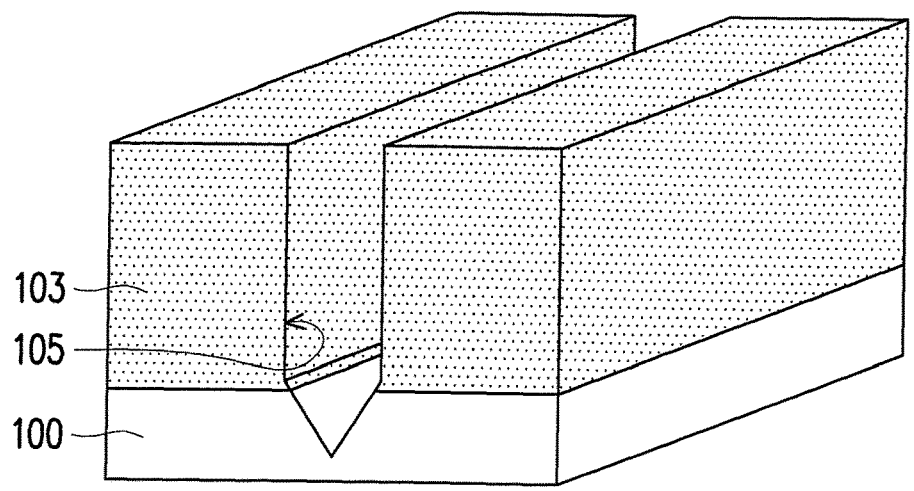

Referring to FIG. 1B, the at least one dummy fin 101 and a portion of the substrate 100 are removed, so as to form at least one trench 105 in the insulating layer 103. In an embodiment, the trench 105 extends to a portion of substrate 100. In an embodiment, the dummy fin 101 and the insulating layer 103 have different etching rates, and the removing step includes performing an etching process. In an embodiment, a dry etching is performed until the depth of the trench is approximate to the interface between the insulating layer 103 and the substrate 100, and a wet etching is then performed to extend the trench bottom to the substrate 100. In an embodiment, by using the characteristics of different etching rates between crystal planes {111} and {100}, the trench 105 can be formed with a V-shaped bottom, as shown in FIG. 1B. In another embodiment, only a dry etching such as a multi-step dry etching is performed, so the trench 105 is formed with a substantially planar bottom. Thereafter, a cleaning process is performed to remove etching residues on the surface of the trench 105.

Figure 1C:
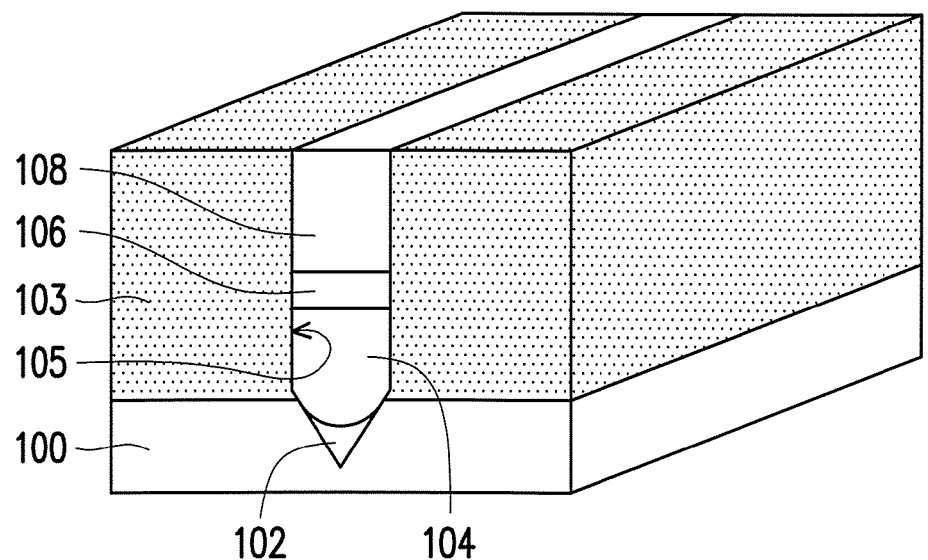

Referring to FIG. 1C, at least one fin (or called "active fin") 110 is formed in the at least one trench 105. The fin 110 includes a seed layer 102, a stress relaxation layer 104, an anti-punch through layer 106 and a channel layer 108 sequentially formed in the trench 105. In an embodiment, the fin 110 extends along a first direction.

The seed layer 102 is configured to repair the substrate surface damaged by the etching processes and therefore reduce the lattice dislocation. In an embodiment, the seed layer 102 and the substrate 100 have substantially the same lattice constant. For example, the seed layer 102 and the substrate 100 are made by silicon. In an embodiment, the seed layer 102 has a dopant concentration of zero or near zero.

The stress relaxation layer 104 is configured to relax the stress distribution of the fin 110. In an embodiment, the stress relaxation layer 104 has a graded stress distribution. The stress relaxation layer 104 can be referred to as a graded stress buffer layer. In an embodiment, the stress atom concentration (such as germanium concentration) of the stress relaxation layer 104 is gradually increased from the seed layer 102 towards the anti-punch through layer 106. Specifically, the seed layer 102 has a germanium concentration of zero or near zero, and the germanium concentration of the stress relaxation layer 104 is gradually increased from zero or near zero to a level substantially equal to the germanium concentration of the anti-punch through layer 106. In other words, the stress relaxation layer 104 has an average germanium concentration between the germanium concentration of the seed layer 102 and the germanium concentration of the anti-punch through layer 106. In an embodiment, the stress relaxation layer 104 has a dopant concentration of zero or near zero. In another embodiment, the stress relaxation layer 104 has a low dopant concentration of, for example, less than about $1\times10^{16}$ cm$^{-3}$.

The channel layer 108 has a germanium concentration of ranging from about 20% to 100%. In an embodiment, the channel layer 108 is made by silicon germanium. In another embodiment, the channel layer 108 is made by germanium. In an embodiment, the channel layer 108 has a dopant concentration of zero or near zero. In another embodiment, the channel layer 108 has a low dopant concentration of, for example, less than about $1\times10^{16}$ cm$^{-3}$.

The anti-punch through layer 106 is configured to prevent punch through from occurring between source/drain regions 118. The anti-punch through layer 106 has a conductivity type opposite to that of the source/drain regions 118 while the same as that of the channel layer 108. The anti-punch through layer 106 includes an N-type dopant or a P-type dopant. In an embodiment, the dopant of the anti-punch through layer 106 includes arsenic, phosphorus or boron. Besides, the anti-punch through layer 106 has a dopant concentration greater than that of the stress relaxation layer 104 or the channel layer 108. In an embodiment, the anti-punch through layer 106 has a dopant concentration of ranging from about $1\times10^{18}$ cm$^{-3}$ to $1\times10^{19}$ cm$^{-3}$, and the stress relaxation layer 104 or the channel layer 108 has a dopant concentration of less than about $1\times10^{16}$ cm$^{-3}$. In an embodiment, the anti-punch through layer 106 and the channel layer 108 have substantially the same lattice constant. For example, the anti-punch through layer 106 and the channel layer 108 are made by silicon germanium or germanium.

Besides, the method of forming each of the seed layer 102, the stress relaxation layer 104, the anti-punch through layer 106 and the channel layer 108 includes performing an epitaxial growth process, such as vapor phase epitaxy (VPE), molecular beam epitaxy (MBE), liquid phase epitaxy (LPE), solid phase epitaxy (SPE) or a suitable epitaxy technique. In an embodiment, as appropriate, an in-situ doping can be performed during the epitaxial growth process. In an embodiment, the channel layer 108 may be grown to exceed the trench 105 because it is the topmost layer. Therefore, a chemical mechanical polishing process can be optionally performed to remove the excess layer outside of the trench 105.

Figure 1D:
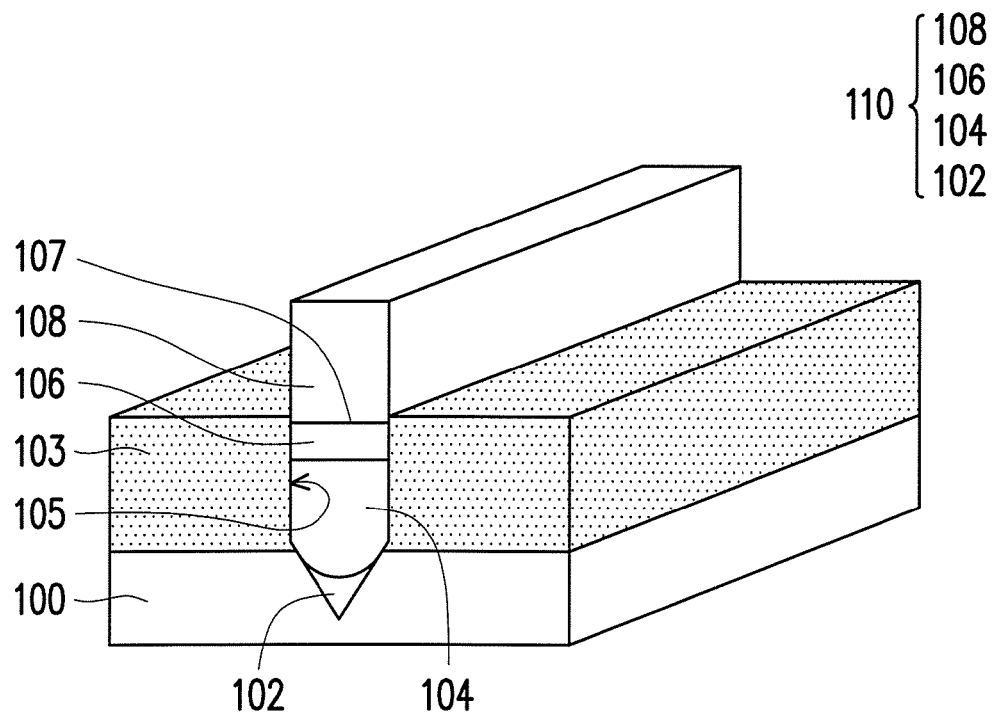

Referring to FIG. 1D, a portion of the insulating layer 103 is removed, so as to expose a portion of the channel layer 108. In an embodiment, after the step of removing the portion of the insulating layer 103, the surface of the remaining insulating layer 103 is higher than the interface 107 between the anti-punch through layer 106 and the channel layer 108. In another embodiment, the surface of the remaining insulating layer 103 can be substantially equal to the interface 107 between the anti-punch through layer 106 and the channel layer 108. Besides, the method of removing the portion of the insulating layer 103 includes performing an etching back process.

Figure 1E:
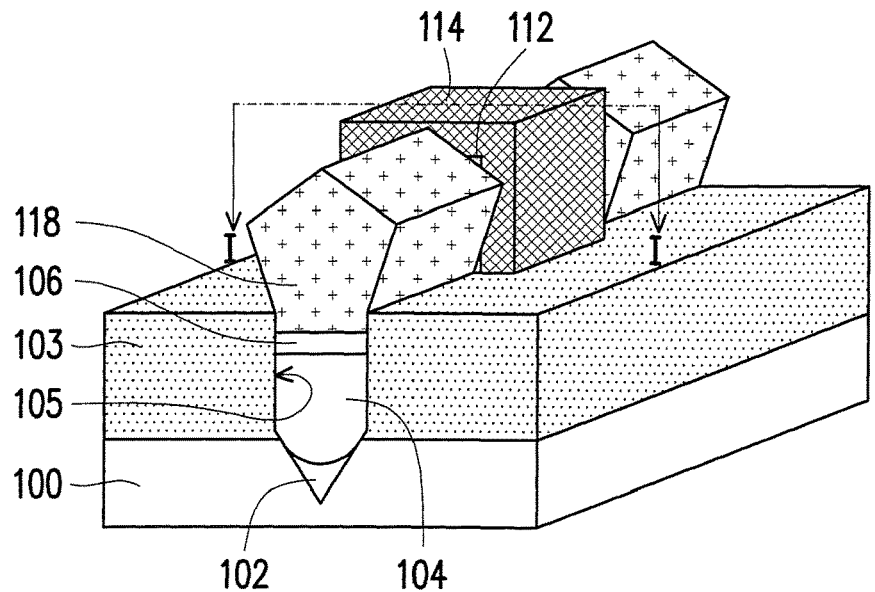

Referring to FIG. 1E and FIG. 2, at least one gate 114 and source/drain regions 118 are formed. The at least one gate 114 is formed across the channel layer 108. The gate 114 includes a silicon-containing material or metal. The silicon-containing material includes polysilicon, amorphous silicon or a combination thereof. The metal includes a work function metal (such as TiAl, TiN or the like) and a low-resistance metal (such as Cu, Al, W or the like). In an embodiment, the gate 114 extends in a second direction different from the first direction. For example, the second direction is perpendicular to the first direction. In an embodiment, a gate dielectric layer 112 is disposed between the gate 114 and the channel layer 108. The gate dielectric layer 112 includes a high-dielectric constant (high-k) layer. The high-k layer includes a dielectric material having a dielectric constant greater than about 7 or even greater than about 10, such as metal oxide. The source/drain regions 118 are disposed at two sides of the fin 110. In an embodiment, the bottoms of the source/drain regions 118 extend downwardly to a portion of the anti-punch through layer 106, but do not exceed the bottom of the anti-punch through layer 106. The source/drain regions 118 include epitaxial layers (such as SiGe, SiP or SiC layers) and doped regions (such as N-type or P-type doped regions).

In an embodiment, the gate dielectric layer 112 including a high-k material and the gate 114 including a silicon-containing material are formed prior to the formation of the source/drain regions 118.

In another embodiment, the gate dielectric layer 112 including a high-k material and a dummy gate including a silicon-containing material are formed. The source/drain regions 118 are then formed. Afterwards, the metal-containing gate 114 is formed to replace the dummy gate. The FinFET of the present invention is thus completed.

The FinFET structure of the present invention is illustrated with reference to FIG. 1E and FIG. 2 in the following. The FinFET of the invention includes a substrate 100, an insulating layer 103, at least one fin 110 and at least one gate 114. The fin 110 includes, from bottom to top, a seed layer 102, a stress relaxation layer 104, an anti-punch through layer 106 and a channel layer 108. A portion of the at least one fin 101 is embedded in the substrate 100. In an embodiment, the seed layer 102 and a portion of the stress relaxation layer 104 are disposed in the substrate 100. The insulating layer 103 surrounds a lower portion of the fin 110. In an embodiment, the surface of the insulating layer 103 is higher than the interface 107 between the anti-punch through layer 106 and the channel layer 108. The at least one gate 114 is across the at least one fin 110. In an embodiment, the gate 114 is across the channel layer 108 of the fin 110.

It is noted that, in the fin 110 of the invention, the substrate 100 and the seed layer 102 have substantially the same lattice constant, and the anti-punch through layer 106 and the channel layer 108 have substantially the same lattice constant. Besides, the stress relaxation layer 104 with the graded lattice constant is disposed between the seed layer 102 and the anti-punch through layer 106. Specifically, in the fin 110 of the invention, the germanium concentration of the channel layer 108 is substantially equal to the germanium concentration of the anti-punch through layer 106, the germanium concentration of the anti-punch through layer 106 is greater than the germanium concentration (or average germanium concentration) of the stress relaxation layer 104, and the germanium concentration (or average germanium concentration) of stress relaxation layer 104 is greater than the germanium concentration of seed layer 102. In an embodiment, the fin 110 of the invention has a lower silicon portion, an upper silicon germanium portion, and a middle silicon germanium portion with a graded germanium distribution. In another embodiment, the fin 110 of the invention has a lower silicon portion, an upper germanium portion, and a middle silicon geranium portion with a graded germanium distribution. By such disposition, the lattice mismatch issue of the conventional fin can be avoided.

Besides, the anti-punch through layer 106 of the invention is disposed below the channel layer 108 and between the source/drain regions 118. The anti-punch through layer 106 has a conductivity type opposite to that of the source/drain regions 118 and has a dopant concentration higher than that of the channel layer 108, so that punch through between the source/drain regions can be effectively prevented. Moreover, the bottom of the anti-punch through layer 106 is lower than the bottoms of the source/drain regions 118. In such case, even though the undesired dopant is diffused downwardly, such dopant can be effectively prevented to achieve the anti-punch through effect.

The above-mentioned embodiment in which a germanium-containing fin is grown on a silicon-containing substrate is provided for illustration purposes, and is not construed as limiting the present invention. It is appreciated by people having ordinary skill in the art that the present invention can be applied to another semiconductor substrate (such as a silicon germanium substrate, a silicon carbide substrate, a silicon-on-insulator (SOI) substrate or the like) and to anther fin made by a different material (such as a carbon-containing fin), as long as the lower portion of the fin has a material the same as that of the substrate and the upper portion of the fin has a material with a graded stress distribution.

In summary, in the FinFET of the invention, with the fin made by specific layers/compositions, the lattice mismatch issue of the conventional fin can be successfully resolved, and the punch through effect can be prevented. Therefore, the device performance can be improved, and the competitive advantage can be achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A fin-type field effect transistor (FinFET), comprising:
   a substrate;
   at least one fin, wherein a portion of the at least one fin is embedded in the substrate, the at least one fin comprises, from bottom to top, a seed layer, a stress relaxation layer and a channel layer, the stress relaxation layer comprises germanium, the channel layer comprises a semiconductor material, the stress relaxation layer and the seed layer comprise different materials, and the seed layer has a tapered v-shaped tip at a bottom end thereof; and
   at least one gate, across the at least one fin.

2. The FinFET of claim 1, further comprising an anti-punch through layer disposed between the stress relaxation layer and the channel layer.

3. The FinFET of claim 2, wherein a germanium concentration of the channel layer is substantially equal to a germanium concentration of the anti-punch through layer, the germanium concentration of the anti-punch through layer is greater than a germanium concentration of the stress relaxation layer, and the germanium concentration of the stress relaxation layer is greater than a germanium concentration of the seed layer.

4. The FinFET of claim 2, wherein the stress relaxation layer has a graded stress distribution, and a germanium concentration of the stress relaxation layer is gradually increased from the seed layer towards the anti-punch through layer.

5. The FinFET of claim 2, wherein a dopant concentration of the anti-punch through layer is greater than a dopant concentration of the stress relaxation layer or the channel layer.

6. The FinFET of claim 2, further comprising an insulating layer surrounding a lower portion of the at least one fin, wherein a surface of the insulating layer is higher than an interface between the anti-punch through layer and the channel layer.

7. The FinFET of claim 1, wherein a germanium concentration of the channel layer ranges from about 20% to 100%.

8. The FinFET of claim 1, wherein the seed layer and a portion of the stress relaxation layer are disposed in the substrate.

9. The FinFET of claim 1, wherein the substrate and the seed layer have substantially the same lattice constant, and the anti-punch through layer and the channel layer have substantially the same lattice constant.

* * * * *